United States Patent
Wang et al.

(10) Patent No.: US 9,383,882 B2
(45) Date of Patent: Jul. 5, 2016

(54) CONDUCTIVE SUBSTRATE AND TOUCH PANEL HAVING CONDUCTIVE PADS OF DIFFERENT DIMENSIONS FOR IMPEDANCE COMPENSATION AND REDUCTION

(71) Applicants: Wistron Corporation, New Taipei (TW); eTurboTouch Technology Inc., Taoyuan County (TW)

(72) Inventors: Kuei-Ching Wang, New Taipei (TW); Ta-Hu Lin, New Taipei (TW)

(73) Assignees: Wistron Corporation, Hsichih, New Taipei (TW); eTurboTouch Technology Inc., Zhongli Dist., Taoyuan (TW)

( * ) Notice: Subject to any disclaimer, the term of this patent is extended or adjusted under 35 U.S.C. 154(b) by 56 days.

(21) Appl. No.: 13/900,552

(22) Filed: May 23, 2013

(65) Prior Publication Data

US 2014/0043260 A1 Feb. 13, 2014

(30) Foreign Application Priority Data

Aug. 9, 2012 (TW) .............................. 101128783 A

(51) Int. Cl.
*G06F 3/045* (2006.01)
*G06F 3/041* (2006.01)
(Continued)

(52) U.S. Cl.
CPC ................ *G06F 3/045* (2013.01); *G06F 3/044* (2013.01); *G06F 3/0416* (2013.01); *H05K 1/111* (2013.01); *G06F 2203/04103* (2013.01)

(58) Field of Classification Search
CPC ....... G06F 3/045; G06F 3/047; G06F 3/0416; G06F 2203/04103; H05K 1/11; H05K 1/111

USPC ................ 345/173, 174; 178/18.05; 174/255; 349/150

See application file for complete search history.

(56) References Cited

U.S. PATENT DOCUMENTS

2005/0110772 A1 5/2005 Kong
2008/0013029 A1* 1/2008 Kim .............................. 349/150
(Continued)

FOREIGN PATENT DOCUMENTS

TW 201022769 6/2010

OTHER PUBLICATIONS

Office action mailed on Oct. 28, 2014 for the Taiwan application No. 101128783, filing date: Aug. 9, 2012, p. 1 line 13-14, p. 2 and p. 3 line 1-17 and line 21-22.

(Continued)

*Primary Examiner* — Dwayne Bost
*Assistant Examiner* — Darlene M Ritchie
(74) *Attorney, Agent, or Firm* — Winston Hsu; Scott Margo

(57) ABSTRACT

A conductive substrate includes a substrate, a plurality of conductive areas, a plurality of first conductive wires, a plurality of conductive pads and a plurality of second conductive wires. The conductive areas are disposed on the substrate along a first direction in sequence. The conductive areas are formed and have a plurality of extending conductive portions along a second direction. The conductive portions of two of the adjacent conductive areas are disposed interlacedly. One terminal of each of the first conductive wires is electrically connected to one of the conductive areas. Each of the conductive pads is electrically connected to other terminal of one of the first conductive wires. One terminal of each of the second conductive wire is electrically connected to one of the conductive pads. In addition, a touch panel is also disclosed in the present invention.

15 Claims, 14 Drawing Sheets

(51) Int. Cl.
*H05K 1/11* (2006.01)
*G06F 3/044* (2006.01)

(56) References Cited

U.S. PATENT DOCUMENTS

| | | | | |
|---|---|---|---|---|
| 2008/0314626 A1* | 12/2008 | Moore | | 174/255 |
| 2009/0066669 A1* | 3/2009 | Olson | G06F 3/04883 | 345/174 |
| 2009/0219257 A1* | 9/2009 | Frey | G06F 3/044 | 345/173 |
| 2010/0164899 A1* | 7/2010 | Wu et al. | | 345/174 |
| 2010/0182278 A1* | 7/2010 | Li et al. | | 345/174 |
| 2010/0302204 A1* | 12/2010 | Miyayama | G06F 3/0418 | 345/174 |
| 2011/0134075 A1* | 6/2011 | Takusa | | 345/174 |
| 2011/0157082 A1* | 6/2011 | Lin et al. | | 345/174 |
| 2012/0086670 A1* | 4/2012 | Teil et al. | | 345/174 |
| 2012/0098875 A1* | 4/2012 | Shinkai et al. | | 345/690 |
| 2013/0207923 A1* | 8/2013 | Mohindra | G06F 3/044 | 345/174 |

OTHER PUBLICATIONS

Office action mailed on Dec. 3, 2015 for the China application No. 201310196004.7, p. 3 line 8-29 and Fig. 1A, p. 4-5 and p. 6 line 1-24.

* cited by examiner

CONDUCTIVE SUBSTRATE AND TOUCH PANEL HAVING CONDUCTIVE PADS OF DIFFERENT DIMENSIONS FOR IMPEDANCE COMPENSATION AND REDUCTION

BACKGROUND OF THE INVENTION

1. Field of the Invention

The present invention relates to a conductive substrate and touch panel.

2. Description of the Prior Art

Various types of touch input devices are widely used among electronic products. For instance, a mobile phone and a tablet personal computer usually utilize a touch panel as an input interface, such that a user may perform touch operations on the touch panel to input commands, e.g. drag a finger to move a cursor or write words on the touch panel. Also, the touch panel may cooperate with a display to show virtual buttons which may be selected by the user, so as to input characters and words.

FIG. 1A and FIG. 1B are schematic diagrams illustrating a conventional touch panel 1. The touch panel 1 includes a first substrate 11, a second substrate 12 and a separation layer 13. A plurality of first electrodes 111 is disposed on the first substrate 11 for detecting touch coordinates at an X axis. A plurality of second electrodes 121 is disposed on the second substrate 12 for detecting touch coordinates at a Y axis. The separation layer 13 is disposed between the first substrate 11 and the second substrate 12 for separating the first electrode 111 from the second electrode 121. Noticeably, in order to reduce computation and accelerate coordinates detection, the plurality of first electrodes 111 may have different voltages in response to a specific voltage difference at the X axis, and the plurality of second electrodes 121 may have different voltages in response to a specific voltage difference at the Y axis.

Besides, as shown in FIG. 1B, the first electrodes 111 are respectively and electrically connected to a signal processing module 14 via first conductive wires 112, and the second electrodes 121 are respectively and electrically connected to the signal processing module 14 via second conductive wires 122. The signal processing module 14 may compute a coordinate signal for indicating the touch coordinate according to signals transmitted from the first conductive wire 112 and the second conductive wire 122.

However, each of the first conductive wires 112 and each of the second conductive wire 122 may have length differences due to some layout design or manufacturing concerns. In other words, each of the first conductive wires 112 and each of the second conductive wires 122 may have different impedances, such that the signals generated by the touch may have different attenuations during signal transmission. The longer distance the signal is transmitted, the greater signal attenuation becomes. As a result, the signal processing module 14 may be difficult to accurately compute the touch coordinate according to the voltage differences at the X axis and the Y axis, which leads to false operations of the touch panel 1.

Therefore, quickly and accurately generating coordinate signals for indicating touch locations without influencing by length and voltage differences between conductive wires for the coordinate signals transmission is a topic in the industry.

SUMMARY OF THE INVENTION

It is therefore an objective of the present invention to provide a conductive substrate and touch panel capable of quickly and accurately generating coordinate signals for indicating touch locations without influencing by length and voltage differences between conductive wires for the coordinate signals transmission.

The present invention provides a conductive substrate including a substrate, a plurality of conductive areas, a plurality of first conductive wires, a plurality of conductive pads, and a plurality of second conductive wires. The plurality of conductive areas is disposed on the substrate along a first direction in sequence. One terminal of each of the plurality of first conductive wires is respectively and electrically connected to one of the plurality of the conductive areas. Each of the plurality of conductive pads is respectively and electrically connected to another terminal of each of the plurality of first conductive wires. One terminal of each of the plurality of second conductive wires is respectively and electrically connected to one of the plurality of conductive pads.

In an embodiment of the present invention, the substrate is a transparent glass substrate or a transparent film-liked substrate.

In an embodiment of the present invention, each of the plurality of conductive areas extends along a second direction, and is formed with a plurality of conductive portions at two edges extending along the second direction.

In an embodiment of the present invention, the pluralities of conductive portions of two adjacent conductive areas are interlacedly disposed.

In an embodiment of the present invention, the pluralities of conductive portions of two adjacent conductive areas have a saw-toothed shape or a battlement shape.

In an embodiment of the present invention, the plurality of conductive areas, the plurality of first conductive wires, the plurality of conductive pads and the plurality of second conductive wires are respectively and electrically connected to each other and form a plurality of conduction paths, and each of the plurality of the conduction paths has a same impedance.

In an embodiment of the present invention, another terminal of each of the plurality of second conductive wires is electrically connected to a signal processing module.

The present invention further provides a touch panel including a first conductive substrate, a second conductive substrate and a separation layer. The first conductive substrate includes a first substrate, a plurality of first conductive areas, a plurality of first conductive wires, a plurality of first conductive pads and a plurality of second conductive wires. The plurality of first conductive areas is disposed on the first substrate along a first direction in sequence. One terminal of each of the plurality of first conductive wires is respectively and electrically connected to one of the plurality of first conductive areas. Each of the plurality of first conductive pads is respectively and electrically connected to another terminal of each of the plurality of first conductive wires. One terminal of each of the plurality of second conductive wires is respectively and electrically connected to one of the plurality of first conductive pads. The second conductive substrate includes a second substrate, a plurality of second conductive areas, a plurality of third conductive wires, a plurality of second conductive pads, and a plurality of fourth conductive wires. The plurality of second conductive areas is disposed on the second substrate along a second direction in sequence. One terminal of each of the plurality of third conductive wires is respectively and electrically connected to one of the plurality of second conductive areas. Each of the plurality of second conductive pads is respectively and electrically connected to another terminal of each of the plurality of third conductive wires. One terminal of each of the plurality of fourth conductive wires is respectively and electrically connected to one of the plurality of second conductive pads. The separation layer is disposed between the first conductive substrate and the second conductive substrate.

In an embodiment of the present invention, the substrate is a transparent glass substrate or a transparent film-liked substrate.

In an embodiment of the present invention, each of the plurality of first conductive areas extends along a second direction, and is formed with a plurality of conductive portions at two edges extending along the second direction.

In an embodiment of the present invention, the pluralities of conductive portions of two adjacent first conductive areas are interlacedly disposed.

In an embodiment of the present invention, each of the plurality of second conductive areas extends along a second direction, and is formed with a plurality of conductive portions at two edges extending along the second direction.

In an embodiment of the present invention, the pluralities of conductive portions of two adjacent second conductive areas are interlacedly disposed.

In an embodiment of the present invention, the pluralities of conductive portions of two adjacent second conductive areas have a saw-toothed shape or a battlement shape.

In an embodiment of the present invention, the plurality of first conductive areas, the plurality of first conductive wires, the plurality of first conductive pads and the plurality of second conductive wires are respectively and electrically connected to each other and form a plurality of conduction paths, and each of the plurality of conduction paths has a same impedance.

In an embodiment of the present invention, the plurality of second conductive areas, the plurality of second conductive wires, the plurality of second conductive pads and the plurality of second conductive wires are respectively and electrically connected to each other and form a plurality of conduction paths, and each of the plurality of conduction paths has a same impedance.

In an embodiment of the present invention, the touch panel further includes a signal processing module electrically connected to another terminal of each of the plurality of second conductive wires and another terminal of each of the plurality of fourth conductive wire.

In an embodiment of the present invention, the signal processing module includes a programmable logic unit electrically connected to another terminal of each of the plurality of second conductive wires and another terminal of each of the plurality of fourth conductive wires for outputting a first signal indicating the first direction and a second signal indicating the second direction, a conversion unit coupled to the programmable logic unit for outputting a third signal and a fourth signal according to the first signal and the second signal, and a processing unit coupled to the conversion unit for outputting a coordinate signal according to the third signal and the fourth signal.

In an embodiment of the present invention, the touch panel further includes a frame having a containing space for containing the first conductive substrate, the second conductive substrate and the separation layer.

In an embodiment of the present invention, a flat surface is formed on upper surfaces of the first conductive substrate and the frame.

To sum up, the conductive substrate and the touch panel of the present invention are to adjust the sizes (impedances) of the conductive pads, and the conductive pads are respectively and electrically connected between the first conductive wires and second conductive wires to form the conduction paths. As a result, the impedances of the conduction paths may be the same, which may ensure that the stepped voltage difference of the electrode is not influenced by the impedances of the conduction paths, i.e. signal errors may be directly compensated, so as to reach better accurate signal analysis and simplify the coordinate computation of the processing module as well.

In addition, the edges of the conductive areas of the present invention are formed with conductive portions. By disposing conductive portions of two adjacent conductive areas interlacedly, the etching patterns produced during manufacturing may be blurred. As a result, the user may not visually aware the etching patterns, which may improve an appearance of the touch panel.

These and other objectives of the present invention will no doubt become obvious to those of ordinary skill in the art after reading the following detailed description of the preferred embodiment that is illustrated in the various figures and drawings.

DETAILED DESCRIPTION

The following description and figures describe a planar touch panel according to preferable embodiments of the present invention, wherein same elements are denoted with same symbols.

Figure 1A:
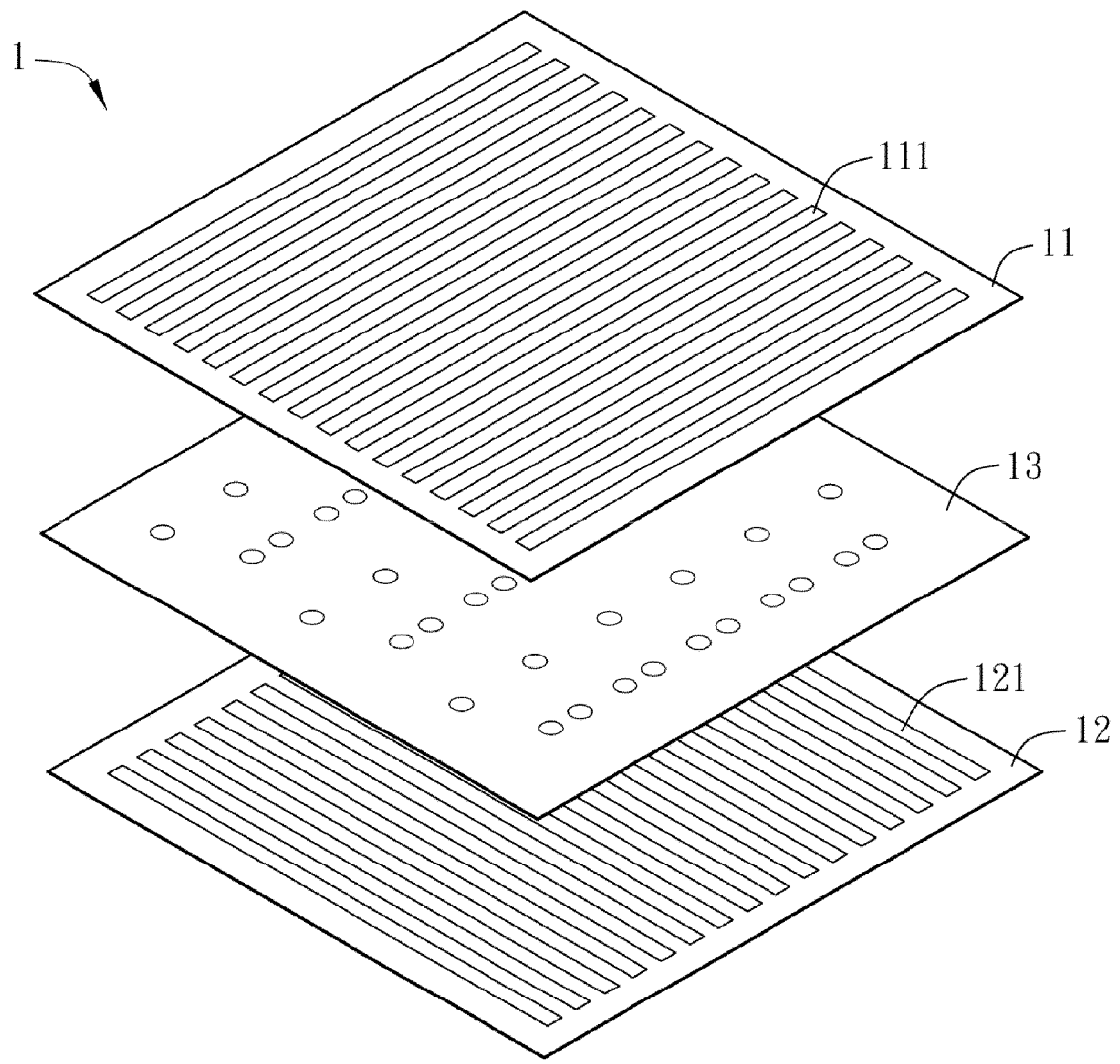
FIG. 1A and FIG. 1B are schematic diagrams illustrating a conventional touch panel.
Figure 1B:
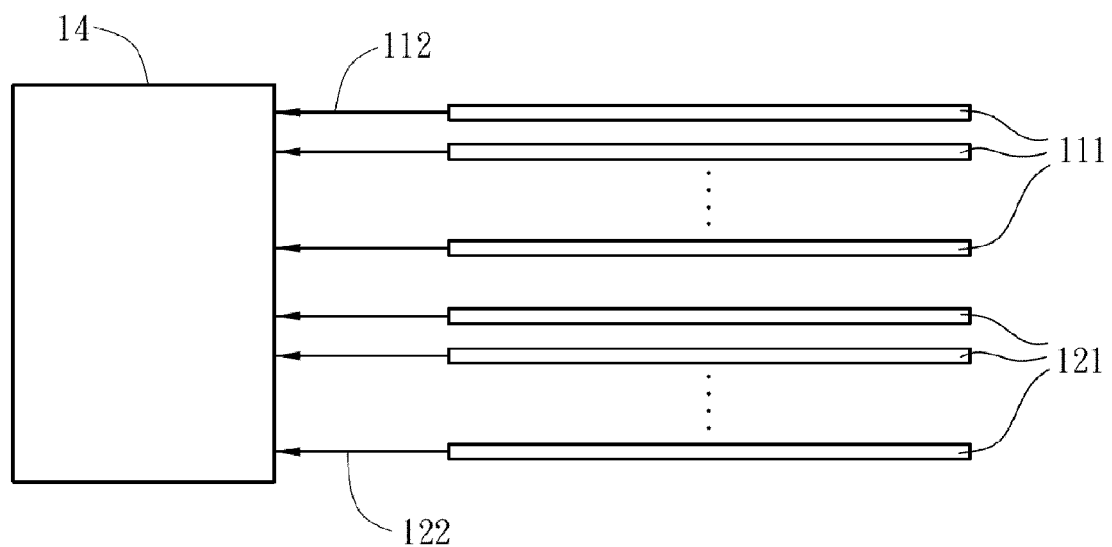
Figure 2A:
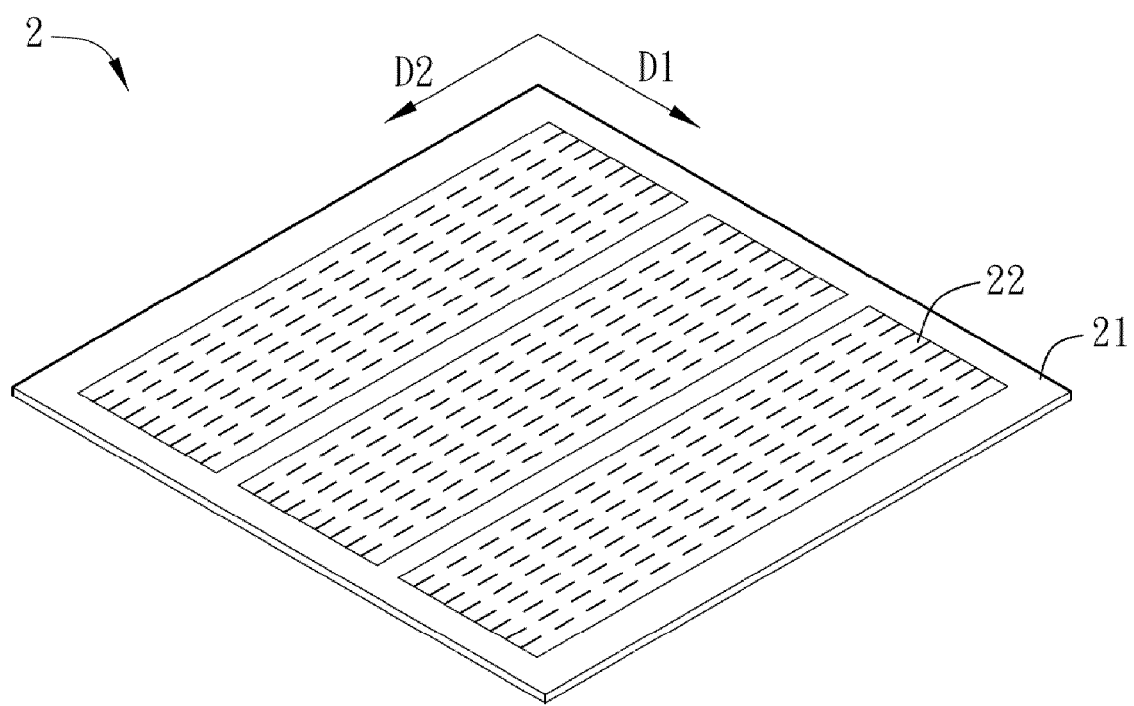
FIG. 2A and FIG. 2B are schematic diagrams illustrating a conductive substrate according to an embodiment of the present invention.
Figure 2B:
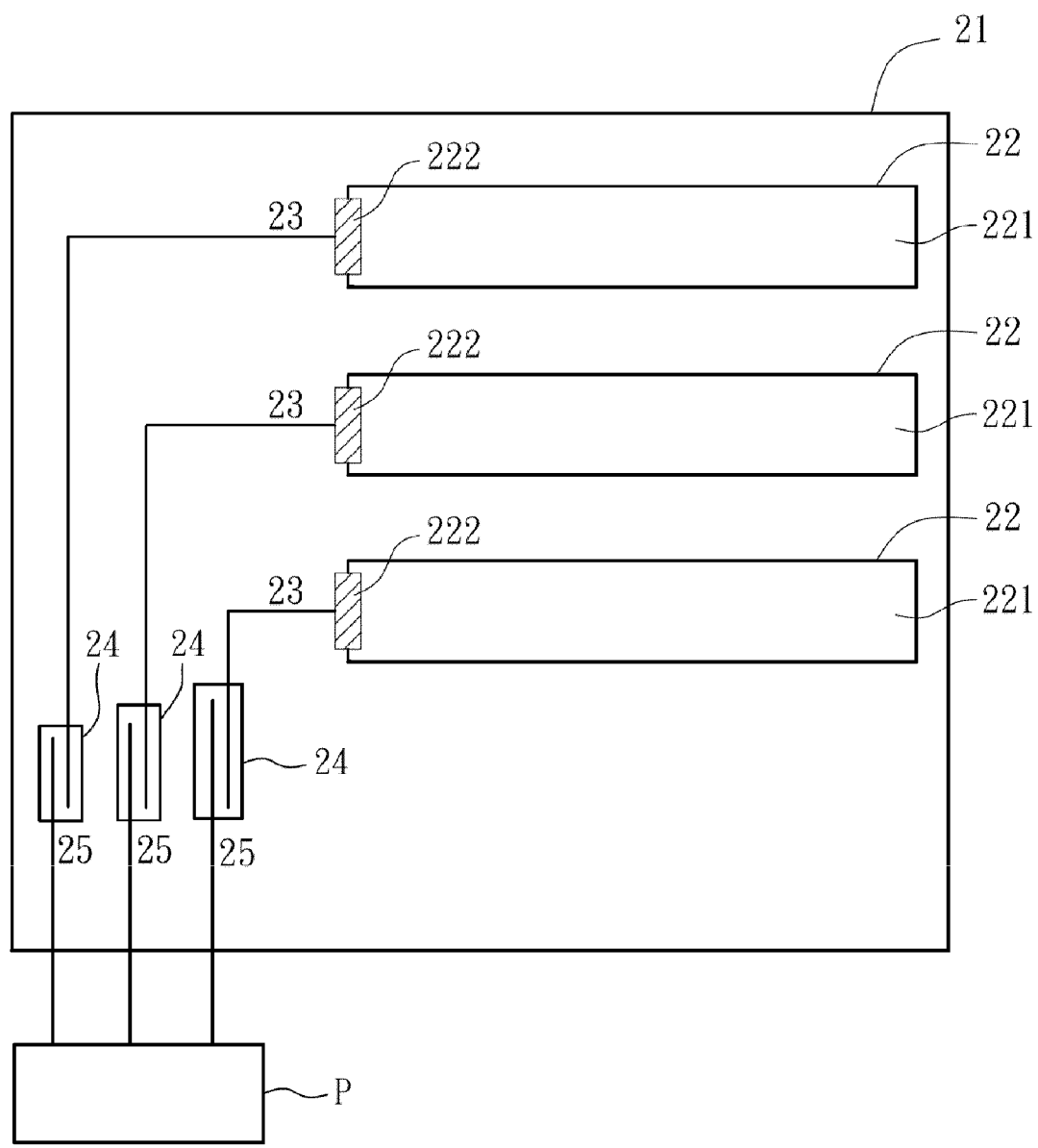

Please refer to FIG. 2A and FIG. 2B, which are schematic diagrams illustrating a conductive substrate 2 according to an embodiment of the present invention. The conductive substrate 2 includes a substrate 21, a plurality of conductive areas 22, a plurality of first conductive wires 23, a plurality of conductive pads 24 and a plurality of second conductive wires 25. In this embodiment, the conductive substrate 2 may be a touch substrate of a display. The conductive substrate 2 is preferably used for a touch panel according to the following example.

The substrate 21 may be a transparent substrate, such as a plastic substrate or a glass substrate. Certainly, the substrate 21 may be a PI (Polyimide) or a film-liked PET (Polyethylene terephthalate) substrate. Besides, the substrate 21 is not limited to be a film-liked substrate such as an inflexible substrate or a flexible substrate.

The plurality of conductive areas 22 may be disposed on a surface of the substrate 21 along a first direction D1 in sequence, and the plurality of conductive area 22 may extend along a second direction D2. In detail, each of the plurality of conductive areas 22 has a conductive pattern 221 and an electrode 222. The electrode 222 may be electrically connected to one terminal of the conductive pattern 221. In this embodiment, the first direction D1 may be regarded as the direction along the axis X, and the second direction D2 may be regarded as the direction along the axis Y. Therefore, signal traces may be defined on the electrode 22 to detect the touch coordinates at the axis X. In addition, the conductive pattern 221 of the conductive area 22 may be made of transparent materials such as ITO (Indium tin oxide), and the electrode 222 may be made of conductive carbon paste, silver paste, copper, molybdenum or aluminum.

The first conductive wire 23 may be disposed on the substrate 21, and one terminal of each of the first conductive wires 23 may be electrically connected to the electrode 222 of one of the plurality of the conductive areas 22. The first conductive wire 23 may be made of pure metal, alloy or conductive paste containing nano metal particles or micron metal particles according to different manufacturing processes, wherein the metal particles may be silver, titanium, zinc, zirconium, antimony, indium, tin, copper, molybdenum or aluminum.

The conductive pads 24 may be disposed on the substrate 21, and each of the conductive pads 24 is electrically connected to another terminal of one of the plurality of first conductive wires 23. The plurality of conductive pads 24 may be made of ITO or opaque and conductive materials such as silver. In this embodiment, each of the conductive pads 24 has a bar shape, however, the shape of the conductive pads 24 may be adjusted according practical requirements. For example, spaces at edges of the substrate 21 and conductivities of the conductive pad 24 may be considered to design the shape of the conductive pad 24, and the shape of the conductive pad 24 may conform to a trapezoid, a triangle, a circle or other irregular shapes. The conductive pad 24 may be electrically connected to the first conductive wire 23 by directly connecting to an edge of the conductive pad 24, or by covering part of the first conductive wire 23 as shown in FIG. 2B, which are not limited.

The second conductive wire 25 may be disposed on the substrate 21, and one terminal of each of the plurality of second conductive wires 25 may be electrically connected to one of the plurality of conductive pads 24. The second conductive wire 25 may be made of pure metal, alloy or conductive paste containing nano metal particles or micron metal particles according to different manufacturing processes. In implementation, the plurality of first conductive wires 23 and the plurality of second conductive wires 25 may be made of same or different materials according to practical requirements such as layout design and electric characteristics. Moreover, another terminal of each of the plurality of second conductive wires 25 may be electrically connected to a signal processing module P by the same or different ways as the first conductive wire 23 connecting to the signal processing module P. The signal processing module P may be disposed on an FPC (Flexible Printed Circuit Board).

The first conductive wires 23, the second conductive wires 25 and the conductive pads 24 may be formed but not limited thereto by lithography or screen printing, wherein the screen printing may have a better manufacturing efficiency to form conductive patterns.

In such a structure shown in FIG. 2A and FIG. 2B, the conductive area 22, the first conductive wire 23, the conductive pads 24 and the second conductive wires 25 electrically connected to each other may form a conduction path to transmit the signal generated by the conductive area 22 from the first conductive wires 23, the conductive pads 24 and second conductive wires 25 to the signal processing module P.

In this embodiment, in order to prevent signal attenuations due to various impedances of conduction paths and ensure accuracy for signal analysis, the conductive pad 24 corresponding to each of the first conductive wires 23 and each of the second conductive wires 25 may have different sizes (areas) to compensate wire length differences of each of the first conductive wires 23 and each of the plurality of second conductive wires 25, so as to reach uniform impedances between the conduction paths. As a result, the conduction paths may have a same impedance to ensure that the stepped voltage difference of the electrode is not influenced by the impedance, which may reach better accurate signal analysis and simplify the coordinate computation of the processing module as well.

Noticeably, relative sizes, scales, proportions and locations of the elements shown in FIG. 2A and FIG. 2B are exemplary illustrations, a designer may make modifications accordingly. Besides, the conductive substrate 2 in this embodiment is illustrated with three conductive areas 22. However, any numbers of conductive areas may be disposed on the substrate according practical requirements, e.g. product specification and circuit design.

Figure 3A:
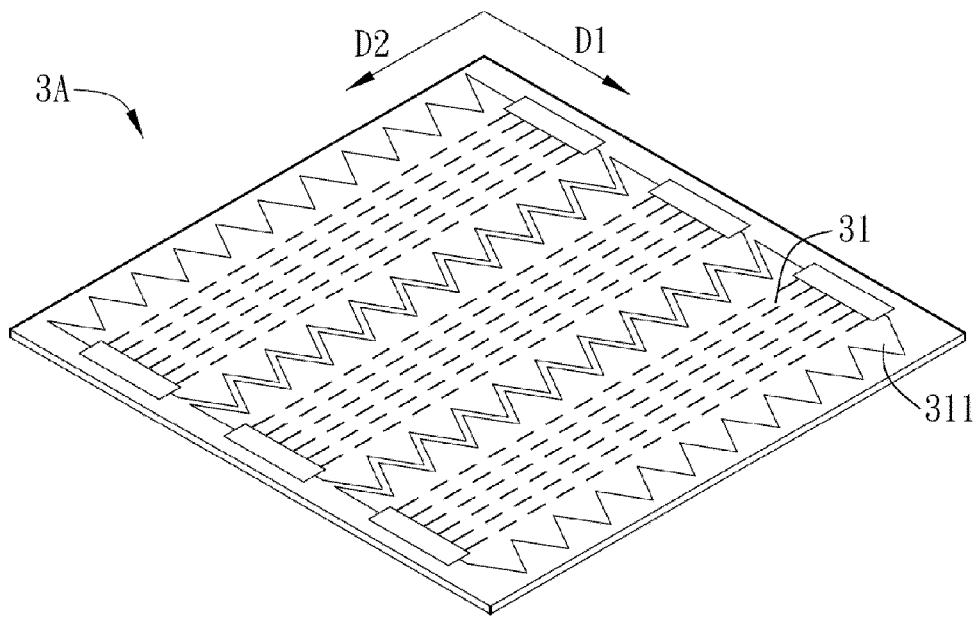
FIG. 3A to FIG. 3D are schematic diagrams illustrating various conductive substrates according to different embodiment of the present invention.

Please refer to FIG. 3A, which is a schematic diagram illustrating a conductive substrate 3A according to another embodiment of the present invention. A difference between the conductive substrate 3A and the conductive substrate 2 is that each of a plurality of conductive areas 31 of the conductive substrate 3A includes a plurality of conductive portions 311 at an edge of the conductive area 31 along the second direction D2, and the conductive portions 311 of two adjacent conductive areas 31 are interlacedly disposed. In other words, in two adjacent conductive areas 31, hilltops of the conductive portions 311 of one of the conductive areas 31 correspond to valleys of the conductive portions 311 of the other conductive areas 31. Since the conductive portions 311 of two adjacent conductive areas 31 are interlacedly disposed, edges of the electrodes may be blurred, and etching patterns produced during manufacturing may be blurred as well. As a result, the user may not be visually aware of the etching patterns, which may improve an appearance of the touch panel.

Figure 3B:
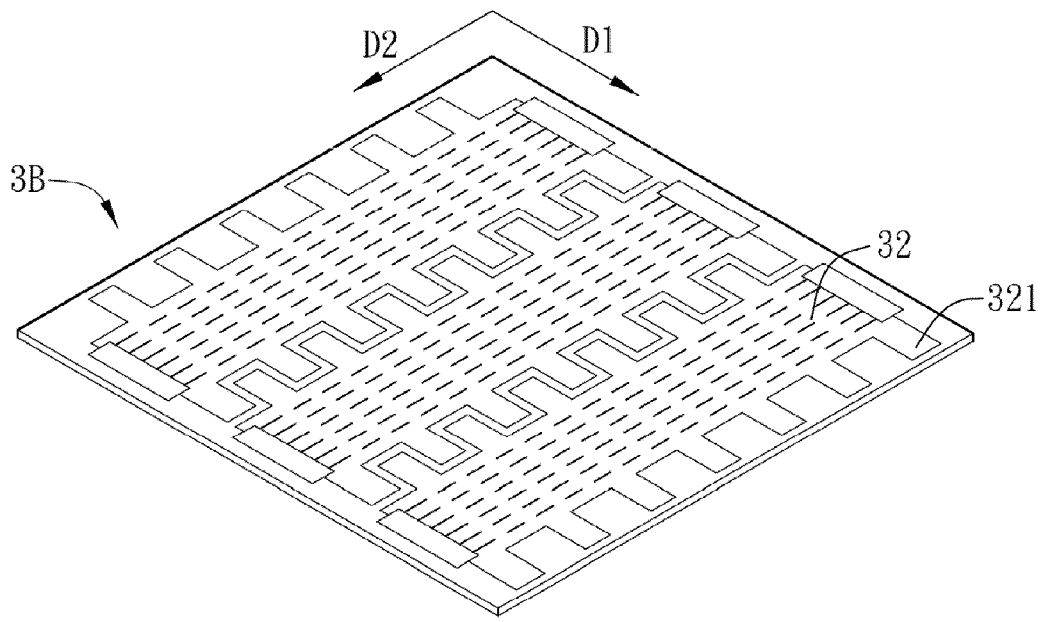
Figure 3C:
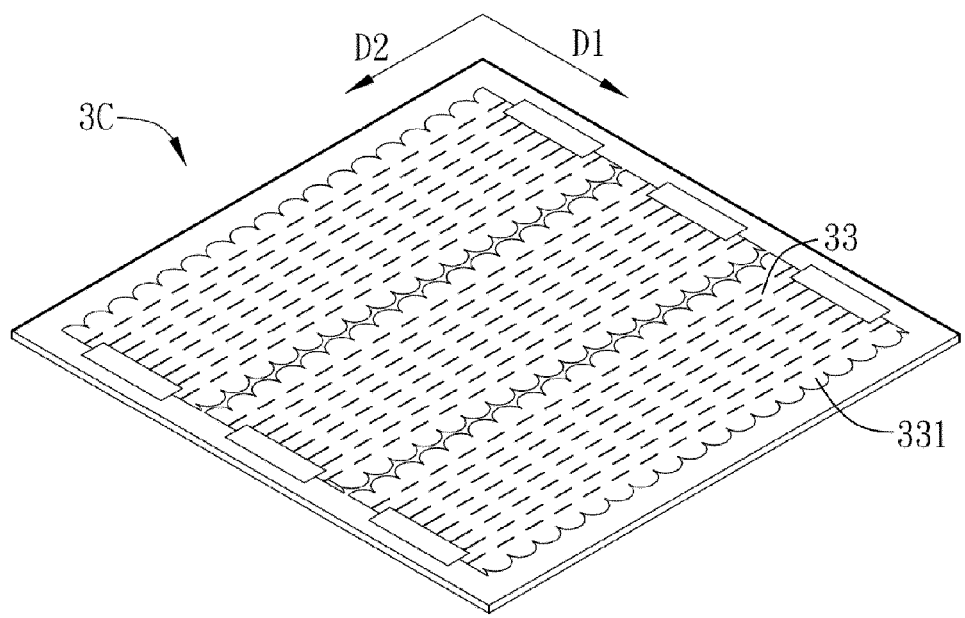
Figure 3D:
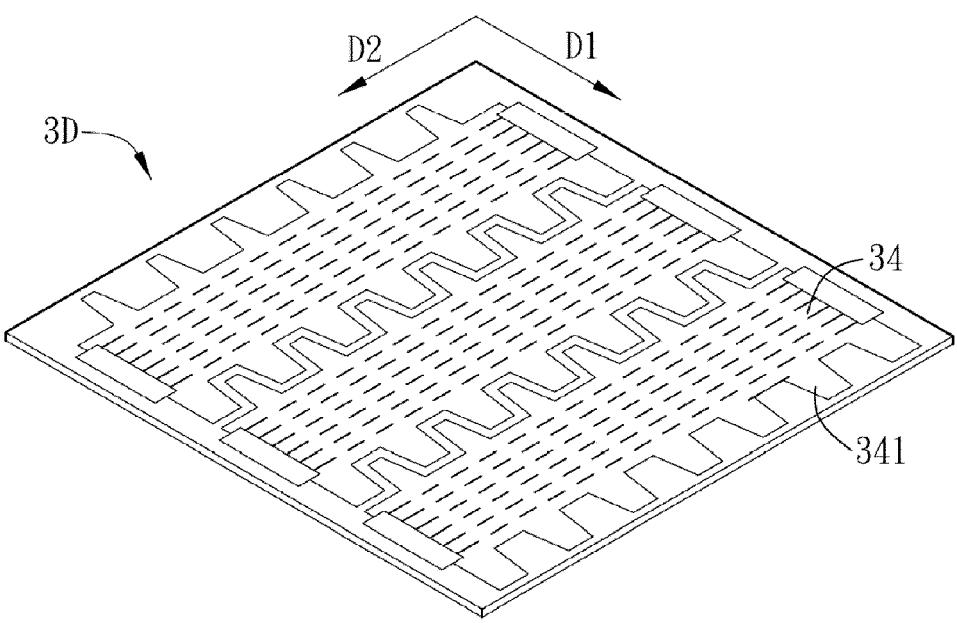

In this embodiment, the conductive portions 311 of the conductive area 31 have a triangle shape, and two adjacent conductive portions 311 of the conductive area 31 are interlacedly disposed in a saw-toothed shape. However, for another application or implementation, the conductive portions may not be the triangle shape. As shown in FIG. 3B, conductive portions 321 of a conductive area 32 of a conductive substrate 3B have a rectangular shape. As shown in FIG. 3C, conductive portions 331 of a conductive area 33 of a conductive substrate 3C have a half-circle shape. As shown in FIG. 3D, conductive portions 341 of a conductive area 34 of a conductive substrate 3D have a trapezoid shape. Besides, the conductive portions shown in FIG. 3B, FIG. 3C or FIG. 3D may be regarded as the conductive portions 311 to be disposed interlacedly.

Figure 4A:
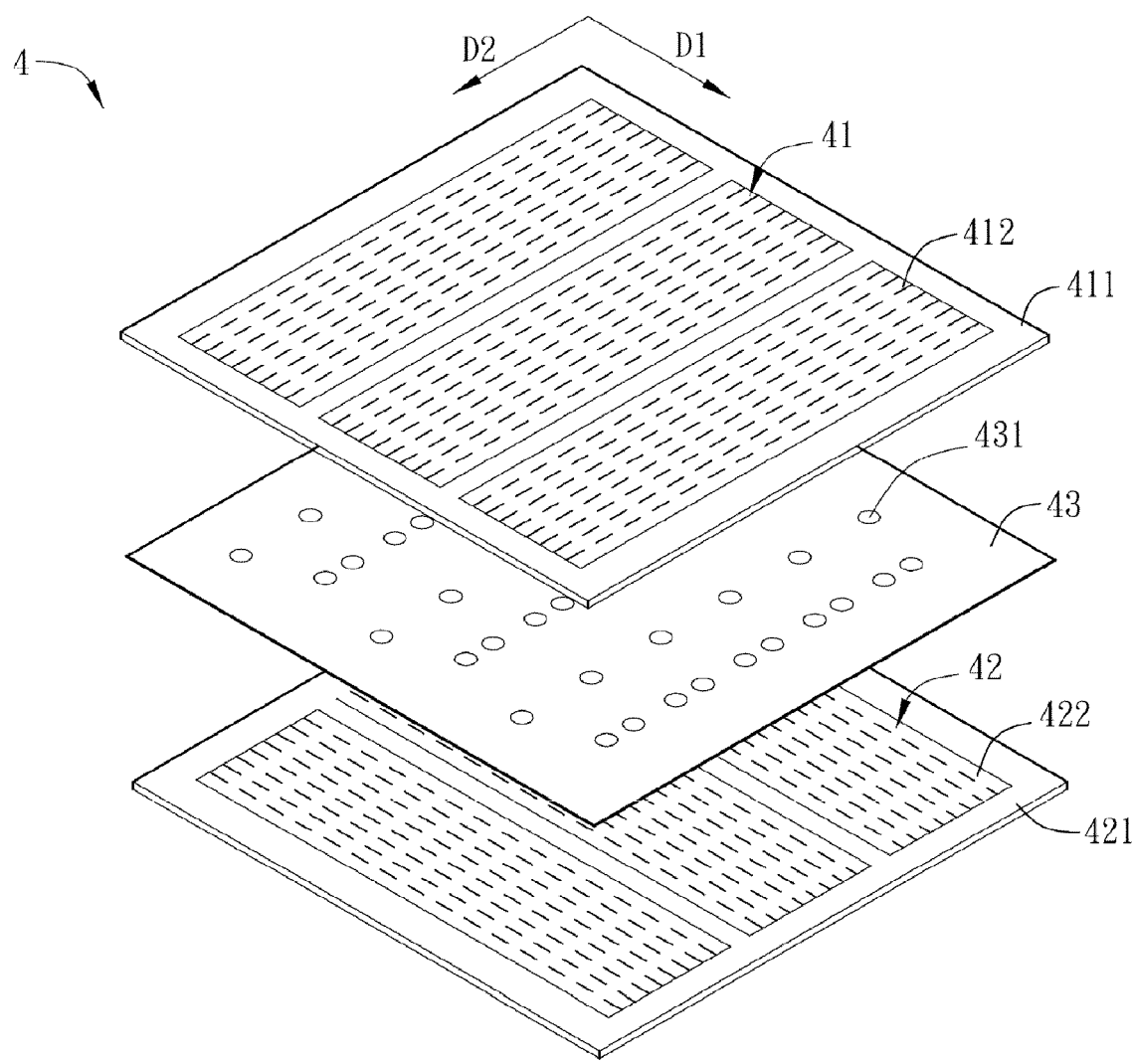
FIG. 4A and FIG. 4B are schematic diagrams illustrating a touch panel according to an embodiment of the present invention.
Figure 4B:
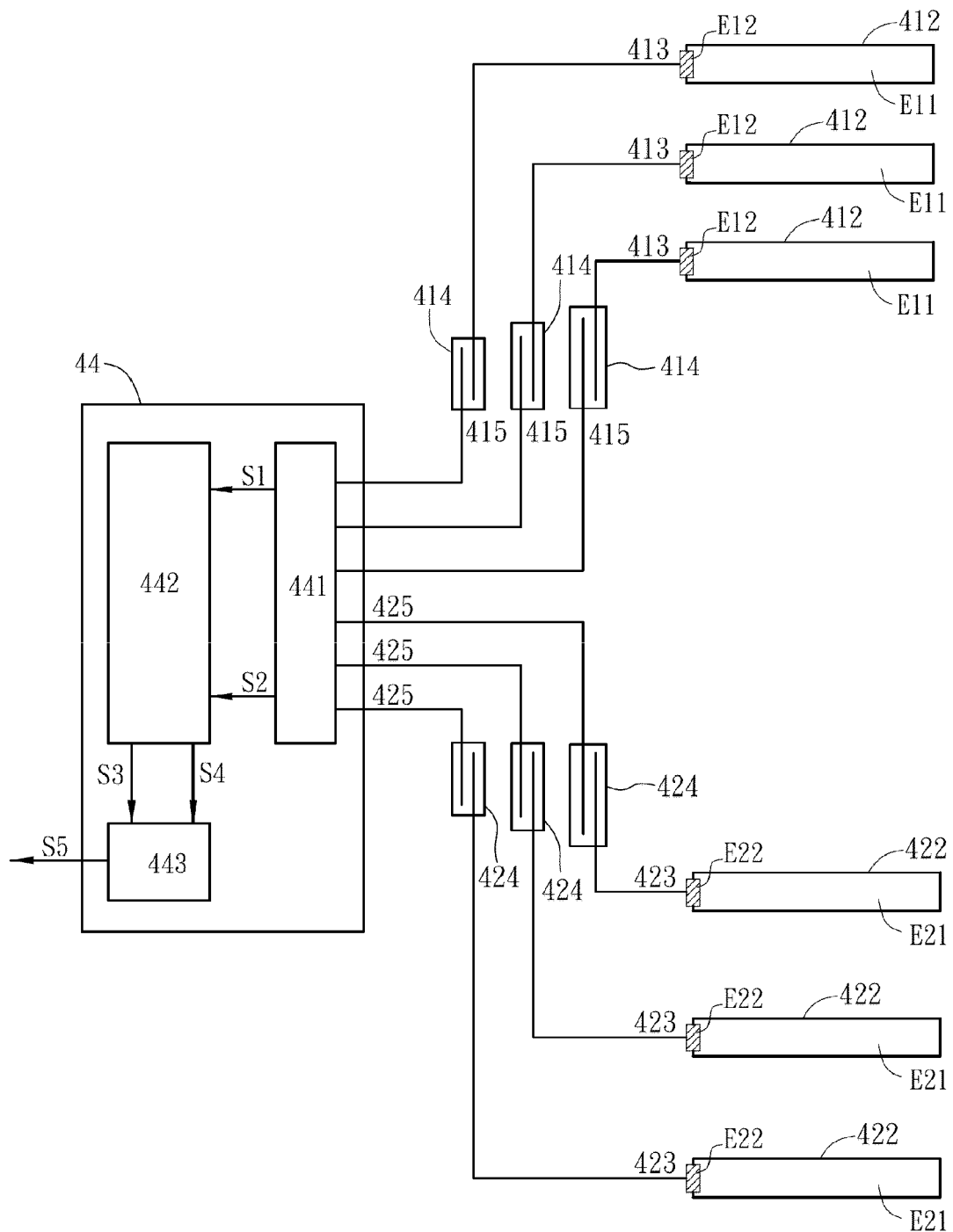

Please refer to FIG. 4A and FIG. 4B, which are schematic diagrams illustrating a touch panel 4 according to an embodiment of the present invention. The touch panel 4 includes a first conductive substrate 41, a second conductive substrate 42 and a separation layer 43. In this embodiment, the touch panel 4 may be a resistive touch panel, or an AMR (Analog Matrix Resistive) touch panel.

The first conductive substrate 41 includes a first substrate 411, a plurality of first conductive areas 412, a plurality of first conductive wires 413, a plurality of first conductive pads 414 and a plurality of second conductive wires 415. The plurality of first conductive areas 412 is disposed on a surface of the first substrate 411 along a first direction D1 in sequence, and each of the plurality of first conductive areas 412 extends along a second direction D2. In implementation, the first substrate 411 may be a transparent substrate such as a plastic substrate or a glass substrate. Certainly, the first substrate 411 may be a film-liked PI (Polyimide) or a PET (Polyethylene terephthalate) substrate. The first substrate 411 may be an inflexible transparent substrate or a flexible transparent substrate.

A plurality of current wires is formed inside each of the plurality of first conductive areas 412. In this embodiment, the first direction D1 may be regarded as the direction along the axis X, and the second direction D2 may be regarded as the direction along the axis Y. Thus, the plurality of first conductive areas 412 may be used for detecting touch coordinates at the axis X. The first conductive area 412 includes a conductive pattern E11 and an electrode E12, wherein the conductive pattern E11 may be made of ITO, the electrode E12 may be made of conductive carbon paste, silver paste or metal.

One terminal of each of the first conductive wires 413 may be electrically connected to one of the plurality of first conductive areas 412. Each of the plurality of first conductive pads 414 may be electrically connected to another terminal of one of the plurality of first conductive wires 413. One terminal of each of the plurality of second conductive wires 415 may be electrically connected to one of the plurality of first conductive pads 414. The plurality of first conductive wires 413 and the plurality of second conductive wires 415 may be made of pure metal, alloy or conductive paste containing nano metal particles or micron metal particles according to different manufacturing processes, wherein the metal particles may be silver, titanium, zinc, zirconium, antimony, indium, tin, copper, molybdenum or aluminum.

In addition, the plurality of first conductive pads 414 may be made of ITO, or opaque and conductive materials such as silver. In this embodiment, each of the plurality of conductive pads 414 has a bar shape. However, in implementation, the shape of the first conductive pad 414 may be adjusted according practical requirements such as layout design or product specification. For example, the shape of the first conductive pad 414 may conform to a trapezoid, triangle, circle or other irregular shapes.

The second conductive substrate 42 and the first conductive substrate 41 are disposed to be opposite to each other. The second conductive substrate 42 includes a second substrate 421, a plurality of second conductive areas 422, a plurality of third conductive wires 423, a plurality of second conductive pads 424 and a plurality of fourth conductive wires 425. The plurality of second conductive areas 422 may be disposed on the second substrate 421 along the second direction D2 in sequence, and each of the plurality of second conductive areas 422 may extend along the first direction D1. In other words, the direction that the first conductive areas 412 extend is perpendicular to the direction that the second conductive areas 422 extend. Moreover, each of the plurality of second conductive areas 422 has a plurality of current wires, and the second conductive area 422 may be used for detecting the touch coordinates at the axis Y. Each of the plurality of second conductive areas 422 includes a conductive pattern E21 and an electrode E22. The conductive pattern E21 may be made of ITO, and the electrode E22 may be made of conductive materials such as carbon paste, silver paste or metal. One terminal of each of the plurality of third conductive wires 423 may be electrically connected to one of the plurality of second conductive areas 422. Each of the plurality of second conductive pads 424 may be electrically connected to another terminal of each of the plurality of third conductive wires 423. One terminal of each of the plurality of fourth conductive wires 425 may be electrically connected to one of the plurality of second conductive pads 424. Operations of the third conductive wires 423, the second conductive pads 424 and the fourth conductive wires 425 may be obtained by referring to descriptions of the first conductive wires 413, the first conductive pads 414 and the second conductive wires 415, which is omitted.

In this embodiment, structures of the conductive wires and the conductive pads may be obtained by referring to the former embodiments, which is omitted. The separation layer 43 may be disposed between the first conductive substrate 41 and the second conductive substrate 42 for separating the first conductive area 412 from the second conductive area 422. In this embodiment, the separation layer 43 may be disposed with a plurality of knobs 431 to spatially separate the first conductive substrate 41 from the second conductive substrate 42. However, the separation layer 43 is not limited to be a sole layer, the separation layer 43 may a formed by disposing the plurality of knobs 431 on a same flat surface.

When the user press the first conductive substrate 41 to provide a touch signal, the first conductive substrate 41 may be deformed to have a depression higher than a height of the knobs 431, such that the first conductive area 412 may contact with the second conductive area 422, and thus the touch panel 4 may output a touch signal or a corresponding voltage to be converted into a coordinate signal, so as to perform touch detection and operation.

In such a structure, the first conductive areas 412, the first conductive wires 413, the first conductive pads 414 and the second conductive wires 415 electrically connected to each other may respectively form conduction paths for transmitting touch signals corresponding to the axis X. The touch signals detected by the first conductive area 412 may be transmitted from the first conductive wires 413, the first conductive pads 414 and the second conductive wires 415 to a signal processing module. Moreover, the second conductive areas 422, the third conductive wires 423, the second conductive pads 424 and the fourth conductive wires 425 electrically connected to each other may respectively form conduction paths for transmitting touch signals corresponding to the axis Y. The touch signals detected by the second conductive area 422 may be transmitted from the third conductive wires 423, the second conductive pads 424 and the fourth conductive wires 425 to the signal processing module. The conduction paths for transmitting the touch signal corresponding to the axis X may have the same impedance, and the conduction paths for transmitting the touch signal corresponding to the axis Y may have a same impedance as well to ensure that the stepped voltage difference of the electrode is not influenced by the impedance. Therefore, the touch signals transmitted by different conduction paths may have nearly uniform attenuation to reach accurate signal analysis, which may also simplify the coordinate computation of the processing module.

Please continue to refer to FIG. 4A and FIG. 4B, in implementation, the touch panel 4 further includes a signal processing module 44. The signal processing module 44 may be electrically connected to another terminal of each of the plurality of second conductive wires 415 and another terminal of each of the plurality of fourth conductive wires 425. In this embodiment, the signal processing module 44 includes a programmable logic unit 441, a conversion unit 442 and a processing unit 443. In addition, the signal processing module 44 may be disposed on an FPCB (flexible printed circuit board).

The programmable logic unit 441 may be electrically connected to another terminal of each of the second conductive wire 415 and another terminal of each of the plurality of fourth conductive wires 425. The programmable logic unit 441 may receive voltage signals generated by the first conductive areas 412 and the second conductive areas 422. The programmable logic unit 441 may output a first signal S1 indicating the first direction D1 and a second signal S2 indicating the second direction D2 according to the received voltage signals. The programmable logic unit 441 may be a CPLD (Complex Programmable Logic Device).

The conversion unit 442 may be coupled to the programmable logic unit 441 for receiving the first signal S1 and the second signal S2, and outputting a third signal S3 and a fourth signal S4 according to the first signal S1 and the second signal S2. The conversion unit 442 may be an analog-to-digital converter. In detail, the conversion unit 442 may convert the first signal S1 indicating the first direction D1 and the second signal S2 indicating the second direction D2 from analog signals into digital signals. In short, the third signal S3 is a digital signal indicating the first direction D1, and the fourth signal S4 is a digital signal indicating the second direction D2.

The processing unit 443 may be coupled to the conversion unit 442 for receiving the third signal S3 and the fourth signal S4 to output a coordinate signal S5. The coordinate signal S5 may indicate a touch location pressed by the user.

Figure 5A:
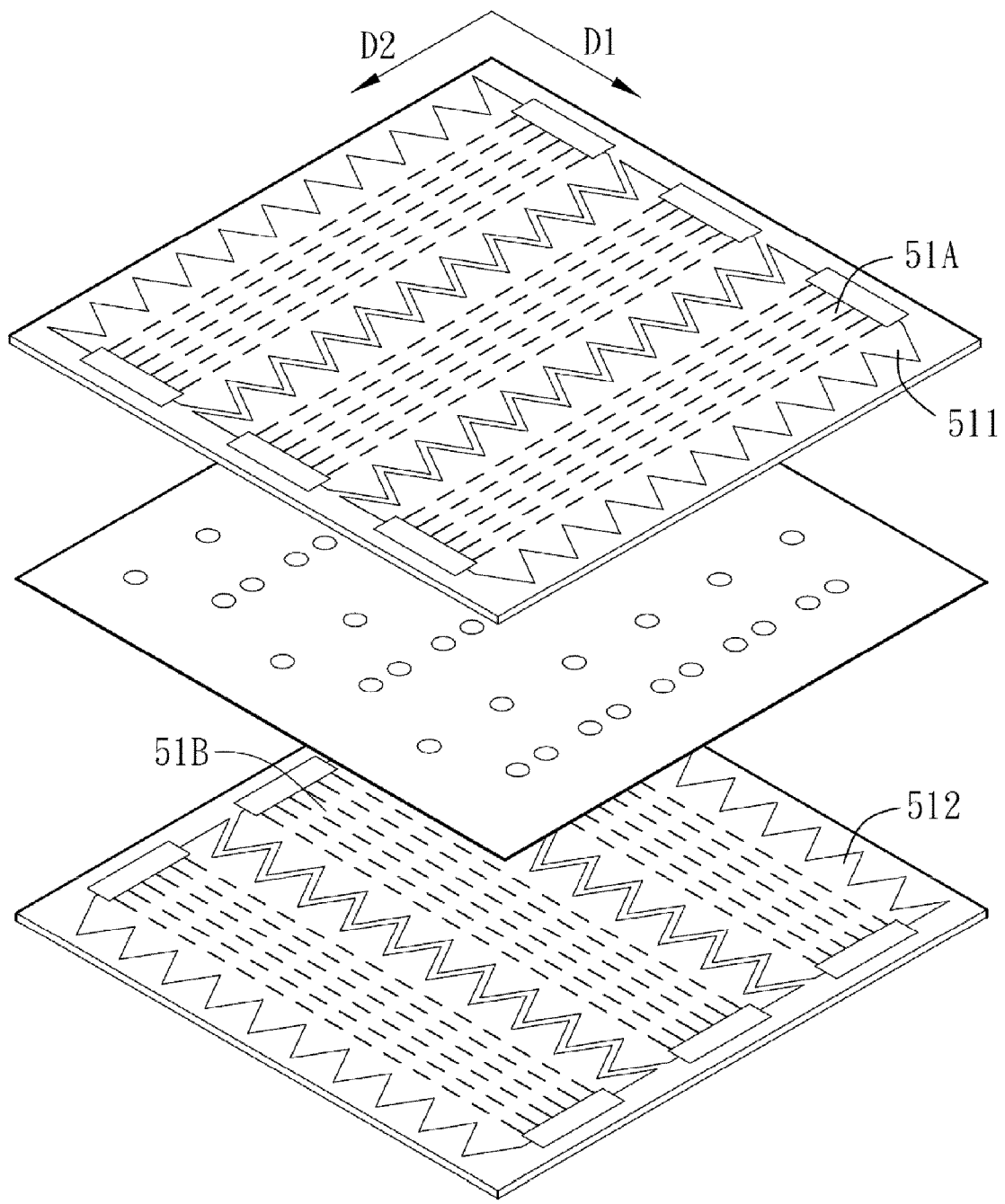
FIG. 5A to FIG. 5D are schematic diagrams illustrating various first conductive areas and second conductive areas according to different embodiment of the present invention.

Please refer to FIG. 5A to FIG. 5D, which are schematic diagrams illustrating various first conductive areas and second conductive areas according to different embodiment of the present invention. As shown in FIG. 5A, a plurality of first conductive areas 51A extends along the second direction D2, and is formed with a plurality of conductive portions 511 at edges along the second direction D2. The conductive portions 511 of two adjacent first conductive areas 51A are interlacedly disposed, or preferably, in a saw-toothed shape. In other words, in two adjacent conductive areas 51, hilltops of the conductive portions 511 of one of conductive areas 51 correspond to valleys of the conductive portions 511 of the other conductive areas 51. In addition, the second conductive areas 51B extend along the first direction D1, and are formed with a plurality of conductive portions 512 at edges along the second direction D2. The conductive portions 512 of two adjacent first conductive areas 51B are interlacedly disposed. In this embodiment, the conductive portions 511 and the conductive portions 512 have a triangle shape.

Figure 5B:
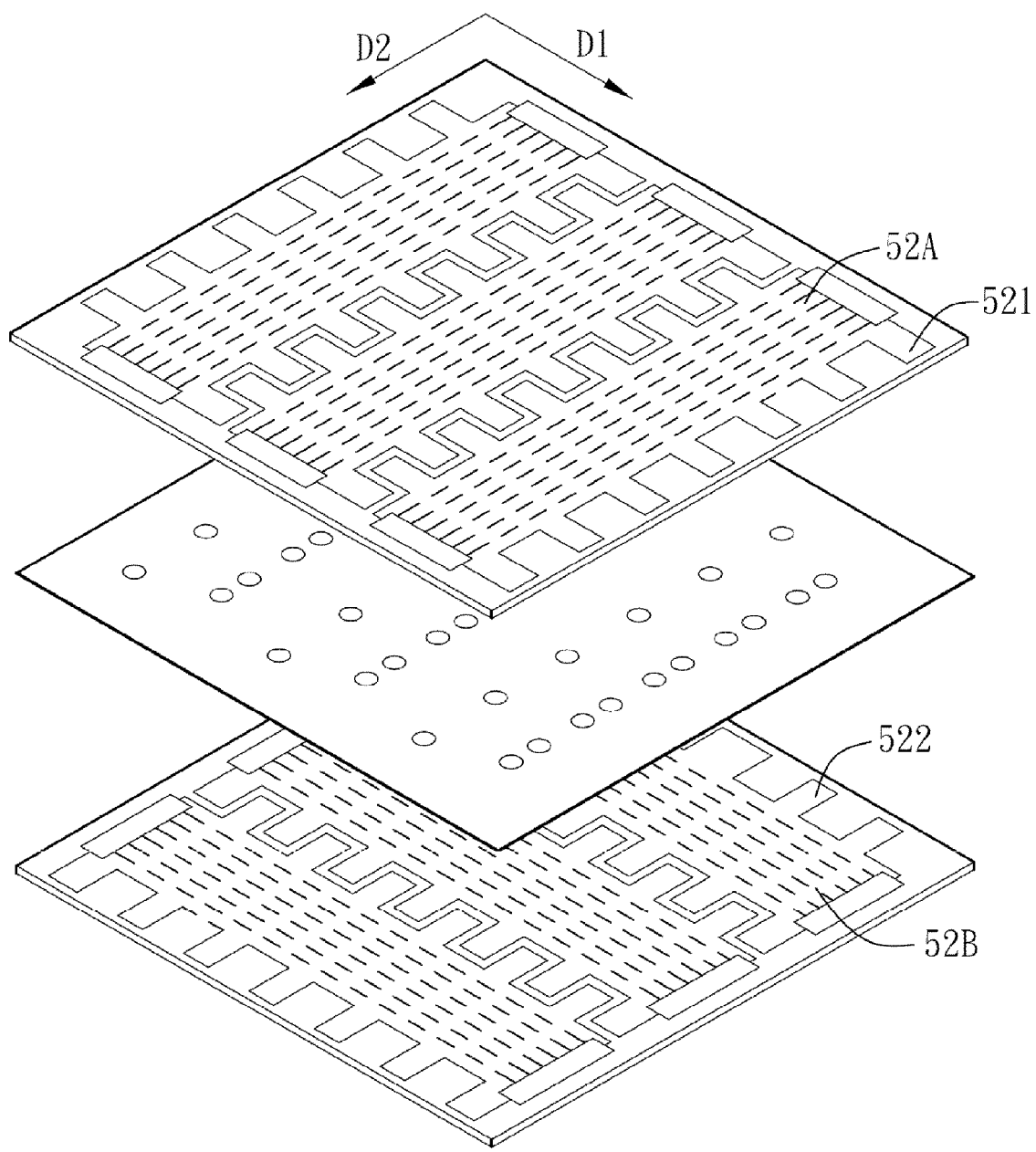
Figure 5C:
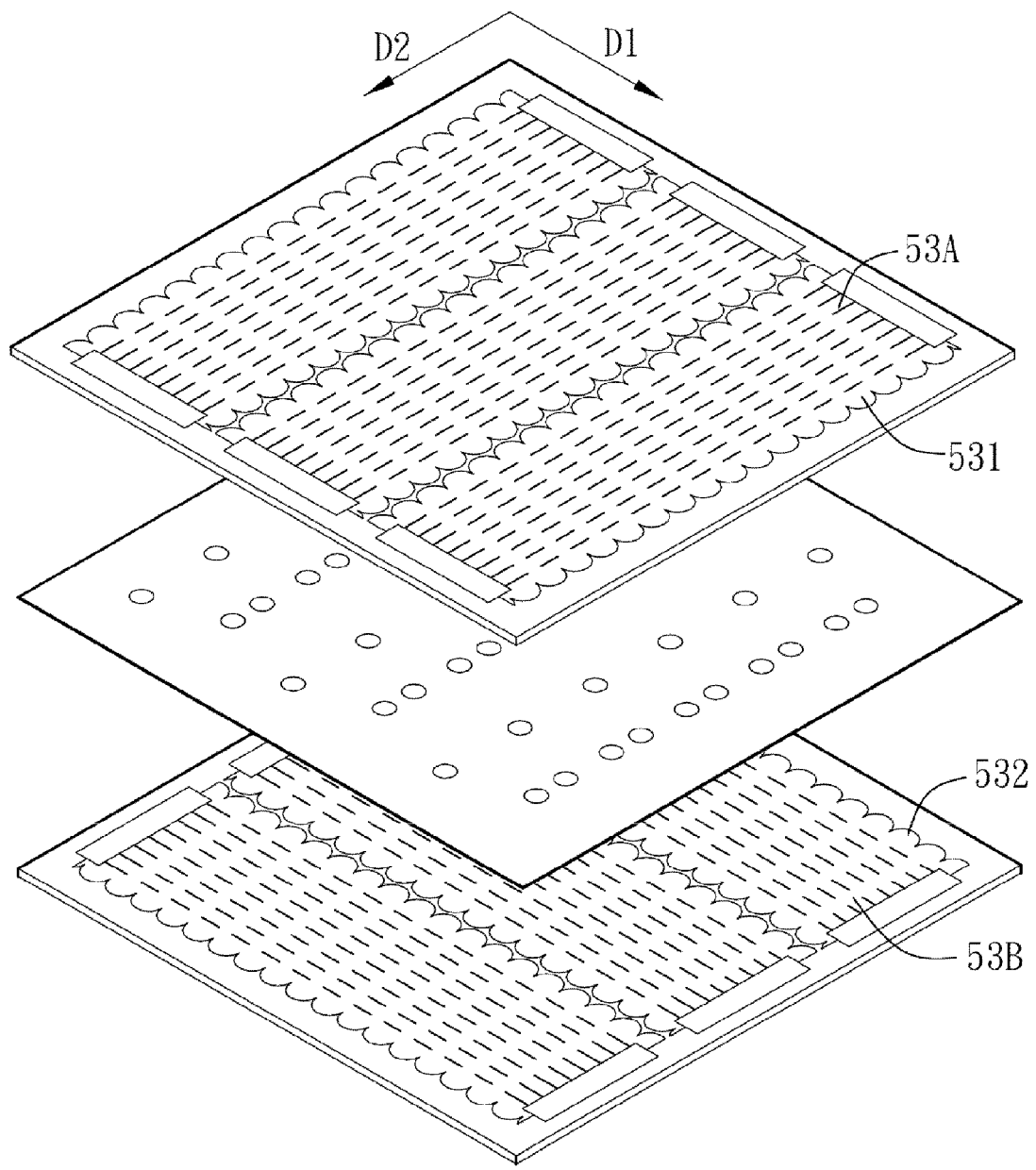
Figure 5D:
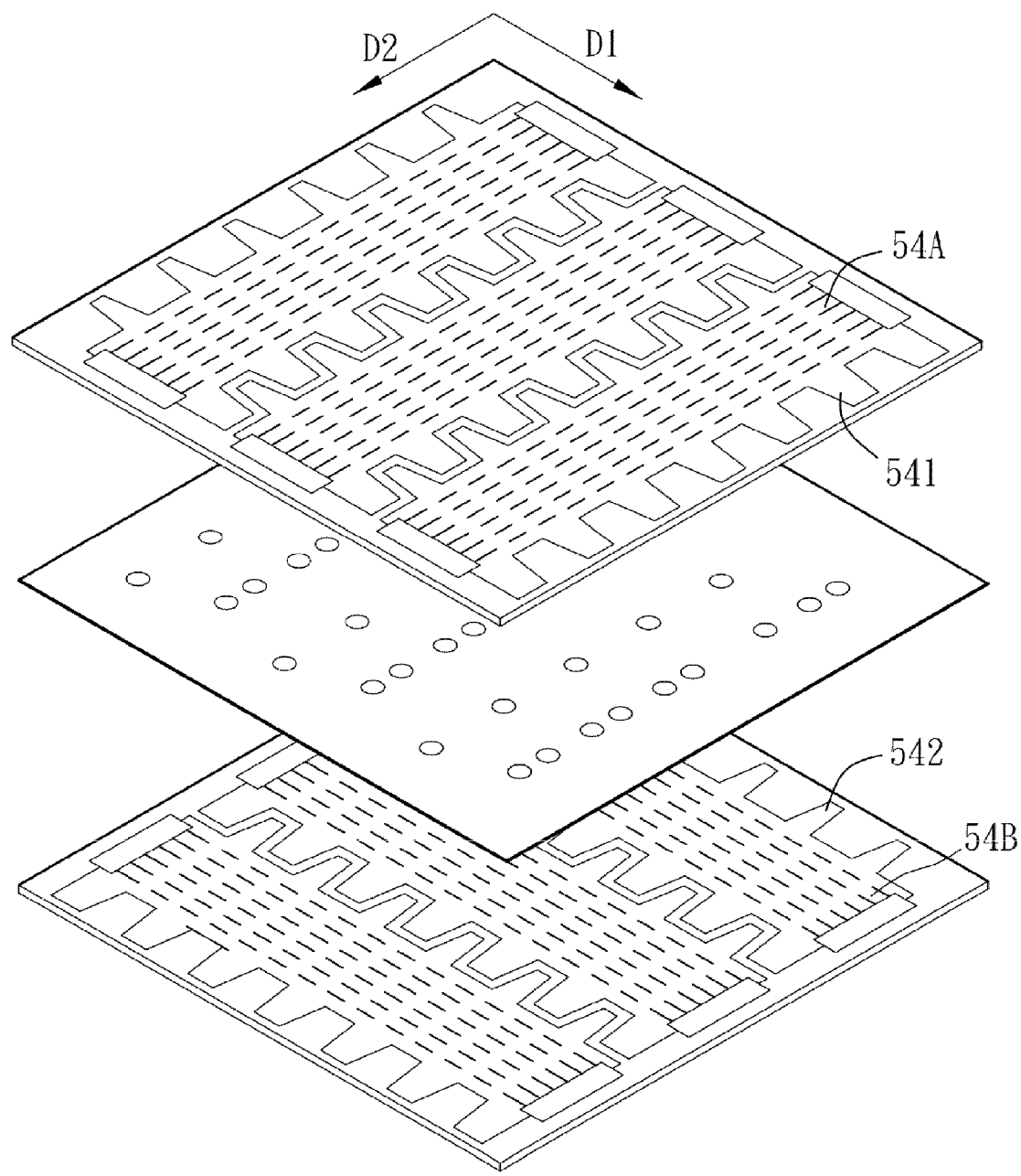

As shown in FIG. 5B, conductive portions 521 of first conductive areas 52A and conductive portions 522 of second conductive areas 52B have a rectangular shape. As shown in FIG. 5C, conductive portions 531 of first conductive areas 53A and conductive portions 532 of second conductive areas 53B have a half-circle shape. As shown in FIG. 5D, conductive portions 541 of first conductive areas 54A and conductive portions 542 of second conductive areas 54B have a trapezoid shape. The three embodiments respectively shown in FIG. 5A to FIG. 5C illustrate battlement-shaped interlaced displacements of the conductive portions, which have less variation on conductive portions in comparison with saw-toothed interlaced displacements, and may be easier to be manufactured.

Noticeably, in the above embodiments, the conductive portions of the first conductive areas and the second conductive areas have the same shape. However, in implementation, the conductive portions of the first conductive areas and the second conductive areas may have different shapes according to practical requirements.

Figure 6A:
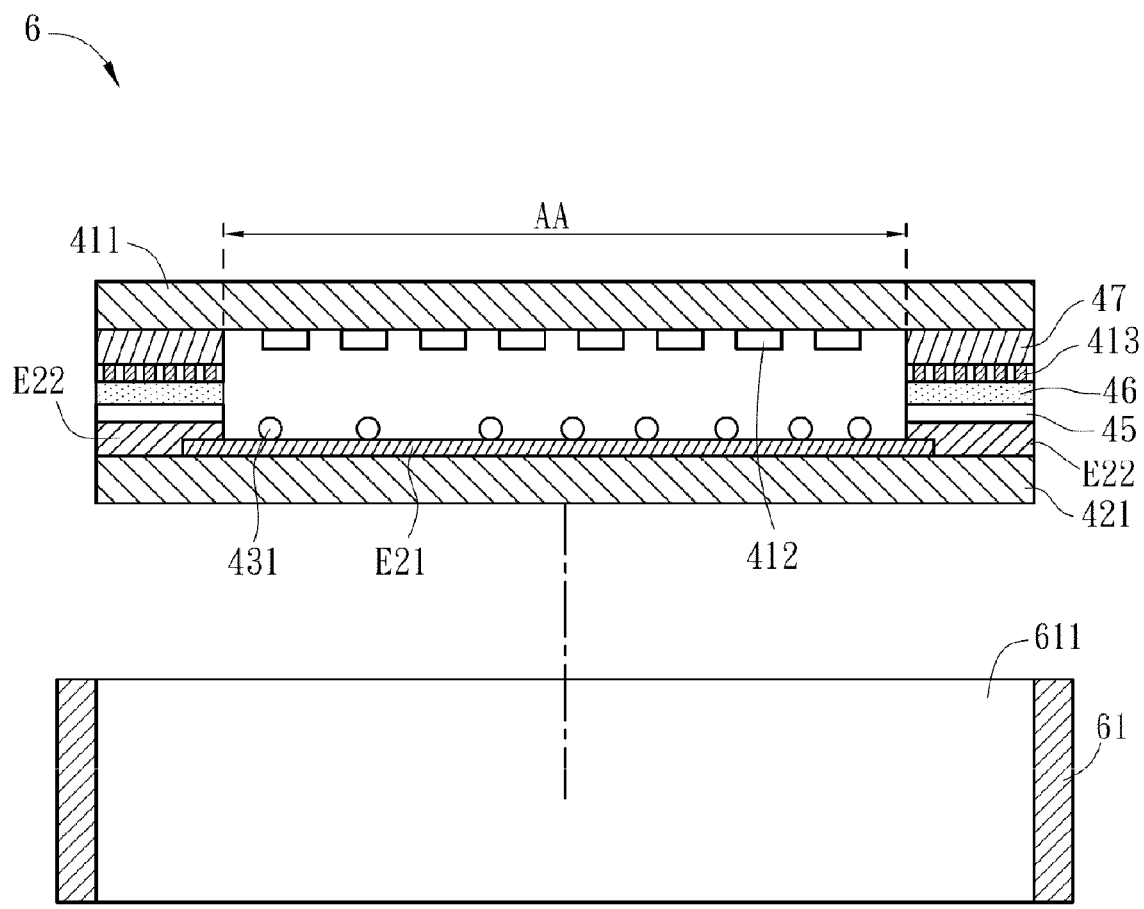
FIG. 6A and FIG. 6B are schematic diagrams illustrating a touch panel according to another embodiment of the present invention.
Figure 6B:
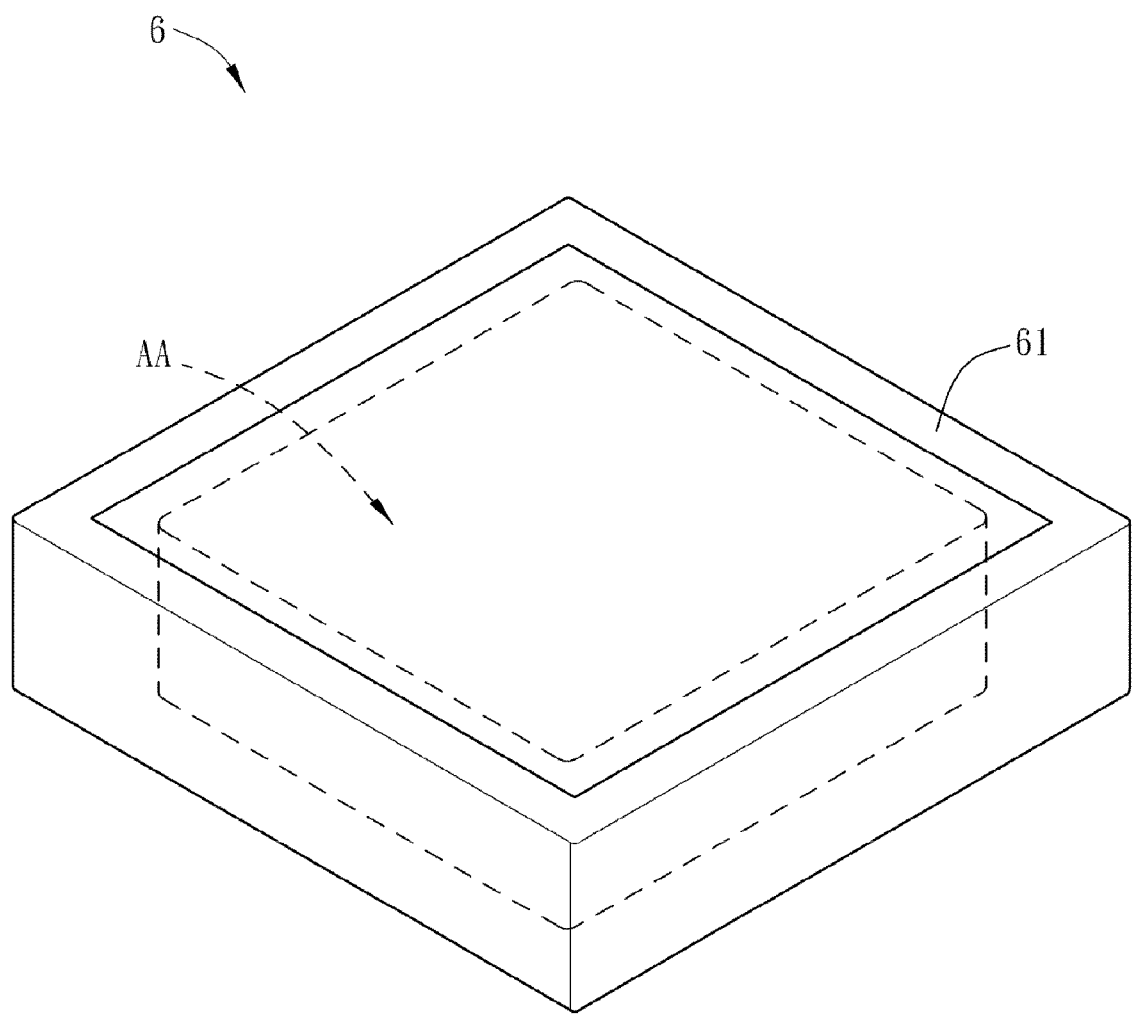

Please refer to FIG. 6A and FIG. 6B, which are schematic diagrams illustrating a touch panel 6 according to another embodiment of the present invention. A difference between the touch panel 6 and the touch panel 4 is that the touch panel 6 further includes a frame 61. The frame 61 includes a containing space 611 for containing the first conductive substrate 41, the second conductive substrate 42 and the separation layer 43. In this embodiment, an insulation layer 45 is disposed on the electrode E22 of the second conductive area 422 of the second conductive substrate 42. The insulation layer 45 may be bonded with the first conductive substrate 41 by an adhesion layer 46. In addition, the first substrate 411 of the first conductive substrate 41 is disposed with a decoration layer 47 for covering traces and elements on edges of the first substrate 411 and second substrate 421, and a touch are AA may be formed within the traces and elements on the edges of the first substrate 411 and second substrate 421.

As shown in FIG. 6B, when the first conductive substrate 41, the second conductive substrate 42 and the separation layer 43 are contained in a containing space 611 of the frame 61, a flat surface is formed on upper surfaces of the first conductive substrate 41 and the frame 61. As a result, a planar touch panel may be formed to provide an operation interface to the user, and the traces and elements on the edges of the first substrate 411 and second substrate 421 may not be touched by the user to prevent false operations.

To sum up, the conductive substrate and the touch panel of the present invention are to adjust the sizes (impedances) of the conductive pads, and the conductive pads are respectively and electrically connected between the first conductive wires and second conductive wire to form the conduction paths. As a result, the impedances of the conduction paths may be the same, which may ensure that the stepped voltage difference of the electrode is not influenced by the impedances of the conduction paths, i.e. signal errors may be directly compensated, so as to reach better accurate signal analysis and simplify the coordinate computation of the processing module as well.

In addition, the edges of the conductive areas of the present invention are formed with conductive portions. By disposing conductive portions of two adjacent conductive areas interlacedly, the etching patterns produced during manufacturing may be blurred. As a result, the user may not be visually aware of the etching patterns, which may improve an appearance of the touch panel.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A conductive substrate, comprising:
 a substrate;
 a plurality of conductive areas disposed on the substrate along a first direction in sequence and which extend along a second direction, wherein the plurality of conductive areas includes a plurality of conductive patterns and a plurality of electrodes;
 wherein the plurality of conductive patterns is formed with a plurality of conductive portions at two edges extending along the second direction, and wherein the conductive portions extend outward from the two edges, such that two adjacent conductive areas are interlacedly disposed;
 a plurality of first conductive wires, one terminal of each of the plurality of first conductive wires respectively and electrically connected to one of the plurality of conductive areas;
 a plurality of conductive pads, each of the plurality of conductive pads respectively and electrically connected to another terminal of each of the plurality of first conductive wires; and a plurality of second conductive wires, one terminal of each of the plurality of second conductive wires respectively and electrically connected to one of the plurality of conductive pads;

wherein the plurality of conductive areas including the plurality of conductive patterns formed with the plurality of conductive portions, the plurality of electrodes, the plurality of first conductive wires, the plurality of conductive pads and the plurality of second conductive wires respectively and electrically connected to each other forms a plurality of conduction paths, and each of the plurality of conduction paths has a same impedance.

2. The conductive substrate of claim 1, wherein the substrate is a transparent glass substrate or a transparent film-like substrate.

3. The conductive substrate of claim 1, wherein the pluralities of conductive portions of two adjacent conductive areas have a saw-toothed shape or a battlement shape.

4. The conductive substrate of claim 1, wherein another terminal of each of the plurality of second conductive wires is electrically connected to a signal processing module.

5. A touch panel, comprising:
a first conductive substrate having a first substrate, a plurality of first conductive areas disposed on the first substrate along a first direction in sequence and which extend along a second direction, a plurality of first conductive wires, one terminal of each of the plurality of first conductive wires respectively and electrically connected to one of the plurality of first conductive areas, a plurality of first conductive pads, each of the plurality of first conductive pads respectively and electrically connected to another terminal of each of the plurality of first conductive wires, and a plurality of second conductive wires, one terminal of each of the plurality of second conductive wires respectively and electrically connected to one of the plurality of first conductive pads, wherein the plurality of first conductive areas includes a plurality of first conductive patterns and a plurality of first electrodes;

wherein the plurality of first conductive patterns is formed with a plurality of conductive portions at two edges extending along the second direction, and wherein the first conductive portions extend outward from the two edges, such that two adjacent first conductive areas are interlacedly disposed;

a second conductive substrate having a second substrate, a plurality of second conductive areas disposed on the second substrate along a second direction in sequence, a plurality of third conductive wires, one terminal of each of the plurality of third conductive wires respectively and electrically connected to one of the plurality of second conductive areas, a plurality of second conductive pads, each of the plurality of second conductive pads respectively and electrically connected to another terminal of each of the plurality of third conductive wires, and a plurality of fourth conductive wires, one terminal of each of the plurality of fourth conductive wires respectively and electrically connected to one of the plurality of second conductive pads, wherein the plurality of second conductive areas includes a plurality of second conductive patterns and a plurality of second electrodes; and a separation layer disposed between the first conductive substrate and the second conductive substrate;

wherein the plurality of first conductive areas including the plurality of first conductive patterns formed with the plurality of conductive portions, the plurality of first electrodes, the plurality of first conductive wires, the plurality of first conductive pads and the plurality of second conductive wires respectively and electrically connected to each other forms a plurality of conduction paths, and each of the plurality of conduction paths has a same first impedance.

6. The touch panel of claim 5, wherein the substrate is a transparent glass substrate or a transparent film-like substrate.

7. The touch panel of claim 5, wherein the pluralities of conductive portions of two adjacent second conductive areas have a saw-toothed shape or a battlement shape.

8. The touch panel of claim 5, wherein the plurality of second conductive areas including the plurality of second conductive patterns, the plurality of second electrodes, the plurality of second conductive wires, the plurality of second conductive pads and the plurality of second conductive wires respectively and electrically connected to each other forms a plurality of conduction paths, and each of the plurality of conduction paths has a same second impedance.

9. The touch panel of claim 5, wherein each of the plurality of second conductive areas extends along a second direction, and is formed with a plurality of conductive portions at two edges extending along the second direction.

10. The touch panel of claim 9, wherein the pluralities of conductive portions of two adjacent second conductive areas are interlacedly disposed.

11. The touch panel of claim 9, wherein the pluralities of conductive portions of two adjacent second conductive areas have a saw-toothed shape or a battlement shape.

12. The touch panel of claim 5, further comprising:
a signal processing module electrically connected to another terminal of each of the plurality of second conductive wires and another terminal of each of the plurality of fourth conductive wires.

13. The touch panel of claim 12, wherein the signal processing module comprises:
a programmable logic unit electrically connected to another terminal of each of the plurality of second conductive wires and another terminal of each of the plurality of fourth conductive wires for outputting a first signal indicating the first direction and a second signal indicating the second direction;
a conversion unit coupled to the programmable logic unit for outputting a third signal and a fourth signal according to the first signal and the second signal; and
a processing unit coupled to the conversion unit for outputting a coordinate signal according to the third signal and the fourth signal.

14. The touch panel of claim 5, further comprising:
a frame having a containing space for containing the first conductive substrate, the second conductive substrate and the separation layer.

15. The touch panel of claim 14, wherein a flat surface is formed on upper surfaces of the first conductive substrate and the frame.

* * * * *